(12) United States Patent
Hao et al.

(10) Patent No.: US 8,872,278 B2
(45) Date of Patent: Oct. 28, 2014

(54) INTEGRATED GATE RUNNER AND FIELD IMPLANT TERMINATION FOR TRENCH DEVICES

(75) Inventors: Jifa Hao, Scarborough, ME (US); Gary Dolny, Luzerne, PA (US); Mark Rioux, Saco, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 144 days.

(21) Appl. No.: 13/280,452

(22) Filed: Oct. 25, 2011

(65) Prior Publication Data
US 2013/0099311 A1    Apr. 25, 2013

(51) Int. Cl.
| H01L 27/088 | (2006.01) |
| H01L 29/66 | (2006.01) |
| H01L 29/78 | (2006.01) |
| H01L 29/06 | (2006.01) |
| H01L 29/423 | (2006.01) |
| H01L 29/417 | (2006.01) |

(52) U.S. Cl.
CPC ........ *H01L 29/0619* (2013.01); *H01L 29/7811* (2013.01); *H01L 29/66727* (2013.01); *H01L 29/7813* (2013.01); *H01L 29/4238* (2013.01); *H01L 29/4236* (2013.01); *H01L 29/66734* (2013.01); *H01L 29/0696* (2013.01); *H01L 29/41766* (2013.01); *H01L 29/42372* (2013.01)
USPC .................... 257/401; 257/409; 257/E21.418

(58) Field of Classification Search
USPC ................. 257/287, 341, 409, 488, 492–493, 257/E29.13, E29.257, E29.201, E21.418, 257/E21.545
See application file for complete search history.

(56) References Cited

U.S. PATENT DOCUMENTS

| 3,404,295 A | 10/1968 | Warner, Jr. |
| 4,003,072 A | 1/1977 | Matsushita et al. |
| 4,300,150 A | 11/1981 | Colak |
| 4,326,332 A | 4/1982 | Kenney |
| 4,404,575 A | 9/1983 | Nishizawa |
| 4,445,202 A | 4/1984 | Goetze et al. |
| 4,805,004 A | 2/1989 | Gandolfi et al. |
| 5,028,548 A | 7/1991 | Nguyen |
| 5,034,341 A | 7/1991 | Itoh |
| 5,075,739 A | 12/1991 | Davies |
| 5,111,253 A | 5/1992 | Korman et al. |
| 5,168,331 A | 12/1992 | Yilmaz |
| 5,233,215 A | 8/1993 | Baliga |
| 5,334,546 A | 8/1994 | Terashima |
| 5,430,324 A | 7/1995 | Bencuya |
| 5,436,189 A | 7/1995 | Beasom |
| 5,473,180 A | 12/1995 | Ludikhuize |
| 5,474,943 A | 12/1995 | Hshieh et al. |
| 5,489,787 A | 2/1996 | Amaratunga et al. |
| 5,510,634 A | 4/1996 | Okabe et al. |
| 5,523,599 A | 6/1996 | Fujishima et al. |

(Continued)

FOREIGN PATENT DOCUMENTS

WO    2006/126164 A2    11/2006

*Primary Examiner* — William F Kraig
*Assistant Examiner* — Khaja Ahmad
(74) *Attorney, Agent, or Firm* — Brake Hughes Bellermann LLP

(57) ABSTRACT

In one general aspect, an apparatus can include a plurality of trench metal-oxide-semiconductor field effect transistors (MOSFET) devices formed within an epitaxial layer of a substrate, and a gate-runner trench disposed around the plurality of trench MOSFET devices and disposed within the epitaxial layer. The apparatus can also include a floating-field implant defined by a well implant and disposed around the gate-runner trench.

18 Claims, 6 Drawing Sheets

(56) References Cited

U.S. PATENT DOCUMENTS

| | | | |
|---|---|---|---|
| 5,541,430 | A | 7/1996 | Terashima |
| 5,554,862 | A | 9/1996 | Omura et al. |
| 5,578,851 | A | 11/1996 | Hshieh et al. |
| 5,597,765 | A | 1/1997 | Yilmaz et al. |
| 5,605,852 | A | 2/1997 | Bencuya |
| 5,639,676 | A | 6/1997 | Hshieh et al. |
| 5,773,851 | A | 6/1998 | Nakamura et al. |
| 5,776,813 | A | 7/1998 | Huang et al. |
| 5,777,373 | A | 7/1998 | Groenig |
| 5,859,446 | A | 1/1999 | Nagasu et al. |
| 5,877,528 | A | 3/1999 | So |
| 5,932,897 | A | 8/1999 | Kawaguchi et al. |
| 6,031,265 | A | 2/2000 | Hshieh |
| 6,110,804 | A | 8/2000 | Parthasarathy et al. |
| 6,114,727 | A | 9/2000 | Ogura et al. |
| 6,190,948 | B1 | 2/2001 | Seok |
| 6,191,447 | B1 | 2/2001 | Baliga |
| 6,204,097 | B1 | 3/2001 | Shen et al. |
| 6,281,547 | B1 | 8/2001 | So et al. |
| 6,303,969 | B1 | 10/2001 | Tan |
| 6,337,499 | B1 | 1/2002 | Werner |
| 6,359,308 | B1 | 3/2002 | Hijzen et al. |
| 6,362,026 | B2 | 3/2002 | Zeng et al. |
| 6,362,505 | B1 | 3/2002 | Tihanyi |
| 6,368,920 | B1 | 4/2002 | Beasom |
| 6,368,921 | B1 | 4/2002 | Hijzen et al. |
| 6,376,315 | B1 | 4/2002 | Hshieh et al. |
| 6,388,286 | B1 | 5/2002 | Baliga |
| 6,396,102 | B1 | 5/2002 | Calafut |
| 6,429,481 | B1 | 8/2002 | Mo et al. |
| 6,436,779 | B2 | 8/2002 | Hurkx et al. |
| 6,437,399 | B1 | 8/2002 | Huang |
| 6,441,454 | B2 | 8/2002 | Hijzen et al. |
| 6,472,678 | B1 | 10/2002 | Hshieh et al. |
| 6,501,146 | B1 | 12/2002 | Harada |
| 6,667,515 | B2 | 12/2003 | Inoue |
| 6,673,680 | B2 | 1/2004 | Calafut |
| 6,683,363 | B2 | 1/2004 | Challa |
| 6,696,728 | B2 | 2/2004 | Onishi et al. |
| 6,710,406 | B2 | 3/2004 | Mo et al. |
| 6,777,747 | B2 | 8/2004 | Yedinak et al. |
| 6,818,947 | B2 | 11/2004 | Grebs et al. |
| 6,825,510 | B2 | 11/2004 | Probst |
| 6,838,722 | B2 | 1/2005 | Bhalla et al. |
| 6,844,592 | B2 | 1/2005 | Yamaguchi et al. |
| 6,861,701 | B2 | 3/2005 | Williams et al. |
| 6,870,220 | B2 | 3/2005 | Kocon et al. |
| 6,936,890 | B2 | 8/2005 | Hueting et al. |
| 6,982,459 | B2 | 1/2006 | Suzuki et al. |
| 6,989,566 | B2 | 1/2006 | Noda et al. |
| 6,995,428 | B2 | 2/2006 | Huang et al. |
| 7,064,385 | B2 | 6/2006 | Dudek et al. |
| 7,078,296 | B2 | 7/2006 | Chau et al. |
| 7,087,958 | B2 | 8/2006 | Chuang et al. |
| 7,098,520 | B2 | 8/2006 | Park et al. |
| 7,208,385 | B2 | 4/2007 | Hossain et al. |
| 7,319,256 | B1 | 1/2008 | Kraft et al. |
| 7,345,342 | B2 | 3/2008 | Challa et al. |
| 7,466,005 | B2 | 12/2008 | Chiola |
| 7,482,205 | B2 | 1/2009 | Herman |
| 7,511,339 | B2 | 3/2009 | Mo et al. |
| 7,521,773 | B2 | 4/2009 | Yilmaz et al. |
| 7,560,787 | B2 | 7/2009 | Kocon |
| 7,595,542 | B2 | 9/2009 | Park et al. |
| 7,598,144 | B2 | 10/2009 | Herrick et al. |
| 7,638,841 | B2 | 12/2009 | Challa |
| 7,859,076 | B2 | 12/2010 | Van Dalen et al. |
| 7,902,071 | B2 | 3/2011 | Marchant |
| 8,063,442 | B2 | 11/2011 | Yilmaz et al. |
| 8,304,829 | B2 | 11/2012 | Yedinak et al. |
| 2003/0132450 | A1 | 7/2003 | Minato et al. |
| 2004/0031987 | A1 | 2/2004 | Henninger et al. |
| 2004/0056302 | A1 | 3/2004 | Grebs et al. |
| 2004/0089910 | A1 | 5/2004 | Hirler et al. |
| 2004/0171198 | A1 | 9/2004 | Zeng |
| 2004/0195620 | A1 | 10/2004 | Chuang et al. |
| 2005/0112808 | A1 | 5/2005 | Shibib et al. |
| 2005/0181564 | A1 | 8/2005 | Hshieh et al. |
| 2005/0202637 | A1 | 9/2005 | Chiola |
| 2005/0242392 | A1 | 11/2005 | Pattanayak et al. |
| 2005/0242411 | A1 | 11/2005 | Tso |
| 2005/0258454 | A1 | 11/2005 | Kumar et al. |
| 2006/0043478 | A1 | 3/2006 | Yamaguchi et al. |
| 2007/0029597 | A1 | 2/2007 | Lee et al. |
| 2007/0138543 | A1 | 6/2007 | Saito |
| 2007/0145514 | A1 | 6/2007 | Kocon |
| 2007/0272977 | A1 | 11/2007 | Saito et al. |
| 2008/0035988 | A1* | 2/2008 | Hshieh .......... 257/330 |
| 2008/0128829 | A1* | 6/2008 | Hshieh .......... 257/401 |
| 2008/0179662 | A1* | 7/2008 | Hshieh .......... 257/328 |
| 2009/0079002 | A1 | 3/2009 | Lee et al. |
| 2010/0117145 | A1* | 5/2010 | Hshieh .......... 257/330 |
| 2010/0140689 | A1 | 6/2010 | Yedinak et al. |
| 2010/0140696 | A1 | 6/2010 | Yedinak et al. |
| 2010/0207205 | A1 | 8/2010 | Grebs et al. |
| 2012/0091516 | A1 | 4/2012 | Yang et al. |
| 2012/0276701 | A1 | 11/2012 | Yedinak et al. |

* cited by examiner

US 8,872,278 B2

INTEGRATED GATE RUNNER AND FIELD IMPLANT TERMINATION FOR TRENCH DEVICES

TECHNICAL FIELD

This description relates to integrated gate runner and field implant termination for trench devices.

BACKGROUND

Known transistor devices can be configured to handle relatively large currents at relatively high voltages. Such transistor devices, which can be referred to as power devices, can include, for example, bipolar and field effect devices including, for example, insulated gate bipolar transistors (IGBTs), metal-oxide-semiconductor field effect transistor (MOSFETs), and so forth. These transistor devices can be configured with various characteristics such as a low on-resistance, fast switching speeds, low current draw during switching operations, relatively low capacitance inherent to their various gate structures, and so forth.

Notwithstanding significant advances in transistor device technologies, one of the limiting factors to higher current ratings is breakdown voltage, particularly in the edge termination region. Because semiconductor junctions may have some non-ideal characteristics (e.g., a finite boundary, variations such as curvature), edge-termination techniques can be employed to, for example, mitigate otherwise high concentrations of electric field lines that may adversely affect breakdown voltage. Unfortunately, many known termination structures included in a transistor device can occupy significant portions of device die area, can be costly to manufacture, and can cause mechanical stress/strain within a semiconductor device. Thus, a need exists for systems, methods, and apparatus to address the shortfalls of present technology and to provide other new and innovative features.

SUMMARY

In one general aspect, an apparatus can include a plurality of trench metal-oxide-semiconductor field effect transistors (MOSFET) devices formed within an epitaxial layer of a substrate, and a gate-runner trench disposed around the plurality of trench MOSFET devices and disposed within the epitaxial layer. The apparatus can also include a floating-field implant defined by a well implant and disposed around the gate-runner trench.

In another general aspect, an apparatus can include a plurality of trench semiconductor devices formed within an epitaxial layer of a substrate, and a gate-runner trench disposed around the plurality of trench semiconductor devices and disposed within the epitaxial layer. The apparatus can also include a polysilicon material disposed within the gate-runner trench and having a recessed portion.

And yet another general aspect, a method can include forming a first doped region within a floating-field region of an epitaxial layer of a substrate, and forming at least a portion of a second doped region within an active region of the epitaxial layer. The method can also include defining a gate-runner trench within a gate-runner region of the epitaxial layer. The gate-runner region of the epitaxial layer can be disposed between the active region of the epitaxial layer and the floating-field region of the epitaxial layer.

The details of one or more implementations are set forth in the accompanying drawings and the description below. Other features will be apparent from the description and drawings, and from the claims.

DETAILED DESCRIPTION

Figure 1:
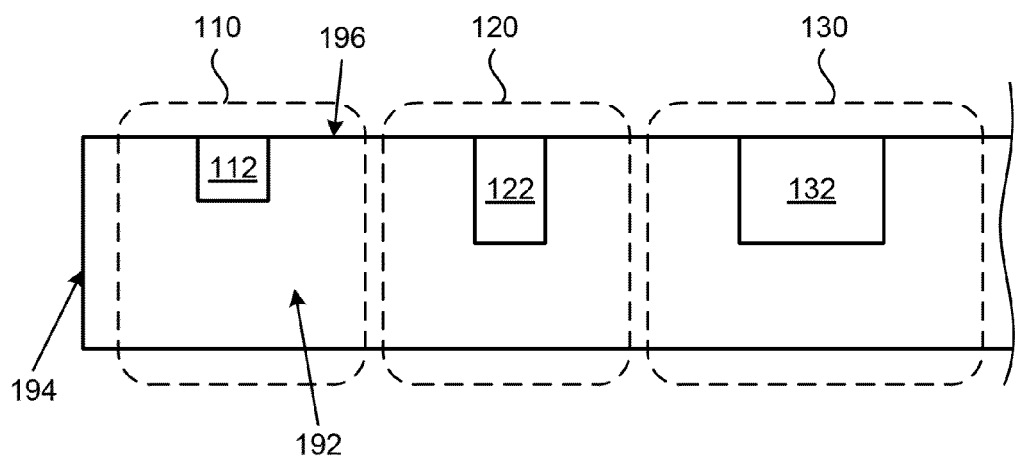
FIG. 1 is a block diagram that illustrates a semiconductor die including several regions.

FIG. 1 is a block diagram that illustrates a semiconductor die 192 including several regions. The semiconductor die 192 has a floating-field region 110, a gate-runner region 120, and an active region 130. As shown in FIG. 1, the gate-runner region 120 is disposed between the floating-field region 110 and the active region 130.

The active region 130 can include a semiconductor device 132. In some embodiments, the semiconductor device 132 can be electrically coupled to multiple other semiconductor devices (not shown). In some embodiments, the semiconductor device 132 can be configured to operate as a single semiconductor device or collectively with multiple other semiconductor devices as a single semiconductor device. In some embodiments, the semiconductor device 132 can be referred to as an active device.

In some embodiments, the semiconductor device 132 (or additional semiconductor devices) can be, for example, any type of power metal-oxide-semiconductor field effect transistor (MOSFET). In some embodiments, the semiconductor device 132 (or additional semiconductor devices) can be, for example, a trench MOSFET device, a trench double-diffused metal-oxide-semiconductor (DMOS) device, a UMOS device, and/or so forth. In some embodiments, the semiconductor device 132 can be any type of a vertically-oriented power device. In some embodiments, the semiconductor device 132 (or an additional semiconductor device) may not be a trench-type device (e.g., a device having or utilizing a trench structure).

The gate-runner region 120 can include a gate runner 122 disposed within a trench. In some embodiments, the gate runner 122, because it is disposed within a trench, can be referred to as a trenched gate runner. In some embodiments, the trench within which the trenched gate runner 122 is disposed can be formed using the same trench process used to form one or more trenches (which can be referred to as device trenches) for the semiconductor device 132. In some embodiments, the trenched gate runner 122 can have portions disposed within multiple trenches (not shown).

The floating-field region 110 can include a floating-field implant 112 that can be formed within the floating-field region 110 using an implant process. Specifically, the floating-field implant 112 (also can be referred to as a field-limiting implant) can be formed using a well implant process (e.g., a P-well implant process, an N-well implant process). In some embodiments, an implant process used to form one or more implants for the semiconductor device 132 can be used to form the floating-field implant 112. In some embodiments, the floating-field region 110 can include multiple floating-field implants (not shown).

In some embodiments, the semiconductor device 132 can be referred to as an edge semiconductor device (e.g., an edge trench MOSFET device) because the semiconductor device 132 can be disposed relatively close to an edge 194 of the semiconductor die 192. In some embodiments, no other semiconductor devices (such as semiconductor devices similar to the semiconductor device 132) may be disposed between the semiconductor device 132 and the edge 194 of the semiconductor die 192 because the semiconductor device 132 is an edge device. Additional semiconductor devices (which may or may not be trenched device) can be disposed to the right of the semiconductor device 132 (in a direction away from the edge 194).

With the floating-field implant 112 in the semiconductor die 192 integrated with the semiconductor device 132, a breakdown voltage of the semiconductor device 132 can be higher than would be possible without the floating-field implant 112. The floating-field implant 112 can be configured to reduce, for example, electric field crowding. In some embodiments, a depletion region (not shown) associated with the semiconductor device 132 can be increased (expanded towards the edge 194) by the floating-field implant 112. Without the floating-field implant 112, the depletion region may be relatively small and the breakdown voltage could be smaller than with the floating-field implant 112. The breakdown voltage associated with the semiconductor device 132 can be higher (and thus the semiconductor device 132 can operate as a higher voltage device) than with the gate runner 122 alone.

In some embodiments, the floating-field implant 112, the gate runner 122 and the semiconductor device 132 can be formed within an epitaxial layer of the semiconductor die 192. In some embodiments, the epitaxial layer can be doped with an N-type dopant or a P-type dopant.

As shown in FIG. 1, the floating-field implant 112 and the trenched gate runner 122 are integrated into the semiconductor die 192 along with the semiconductor device 132. Specifically, the formation of the floating-field implant 112 and the formation of the trenched gate runner 122 are integrated into the processing used to produce the semiconductor device 132. In other words, processing steps used to produce the semiconductor device 132 can also be used to produce the floating-field implant 112 and/or the trenched gate runner 122. In some embodiments, processing steps used to produce the semiconductor device 132 can also be used to produce the floating-field implant 112 and/or the trenched gate runner 122 without additional processing steps specifically for producing the floating field implant 112 and/or the trenched gate runner 122.

Accordingly, the floating-field implant 112 and the trenched gate runner 122 can be produced in an efficient fashion (e.g., a cost-effective fashion). The combination of the trenched gate runner 122 and the floating-field implant 112 can collectively function as an edge termination that may have less sensitivity to surface charge variations than an edge termination that does not include the combination of the trenched gate runner 122 and the floating-field implant 112. Also, the mechanical stress/strain on the trenched gate runner 122 and/or a passivation layer (not shown) can be reduced because the trenched gate runner 122 and the floating-field implant 112 are integrated into the semiconductor die 192. More details related to the benefits of the integration of the floating-field implant 112 and the trenched gate runner 122 into the semiconductor die 192 along with the semiconductor device 132 are described in more detail below.

The elements shown in FIG. 1, and in other figures described herein, are depicting aspects of the semiconductor die 192, and their various relationships, and are not necessarily drawn to scale. Also, in this embodiment, and in other embodiments, references to widths or lengths (which can be average widths or lengths, maximum widths or lengths, minimum widths or lengths, etc.) are distances aligned along (or substantially along) a top surface 196 of the semiconductor die 192, and references to depths (which can be average depths, maximum depths, minimum depths, etc.) are distances aligned orthogonal to (or substantially orthogonal to) the top surface 196 of the semiconductor die 192.

Figure 2:
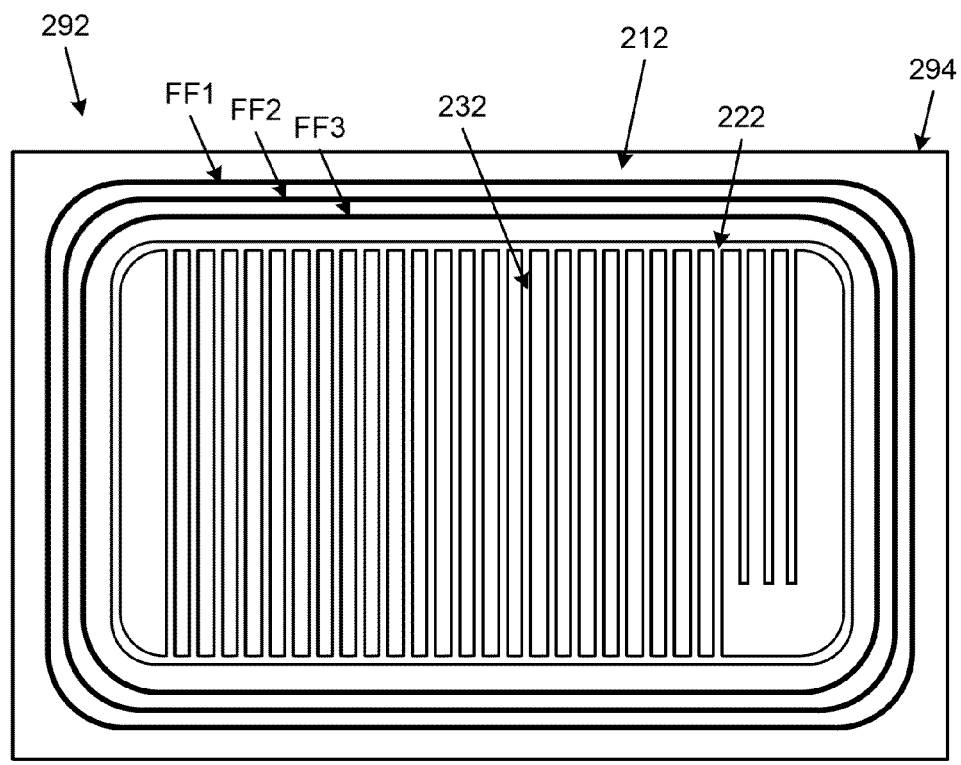
FIG. 2 is a top view of a set of floating-field implants integrated with a trenched gate runner that has at least a portion that is disposed within a trench.

FIG. 2 is a top view of a set of floating-field implants 212 integrated with a trenched gate runner 222 that has at least a portion that is disposed within a trench of a semiconductor die 292. The trench below the trenched gate runner 222 is not shown in FIG. 2. In this embodiment, the trenched gate runner 222 is electrically coupled to several trench gates 232 (e.g., gate electrodes). The trench gates 232 are electrically coupled to semiconductor devices (not shown) (e.g., gates of the semiconductor devices) which have at least some portions disposed below the trench gates 232. By applying a voltage to the trenched gate runner 222 and/or to the trench gates 232, multiple semiconductor devices (which can collectively function as a single semiconductor device) can be activated. An edge 294 of the semiconductor die is shown in FIG. 2. The elements shown in FIG. 2 are to depict aspects of the semiconductor die 192 and are not necessarily drawn to scale.

In this embodiment, the set of floating-field implants 212 includes three rings of floating-field implants 212—FF1 through FF3—disposed around the trenched gate runner 222. In some embodiments, the set of floating-field implants 212 can include less than three rings (e.g., 1 ring, 2 rings) or more than three rings (e.g., 4 rings, 5 rings).

In some embodiments, one or more of the floating-field implants from the set of floating-field implants 212 and/or the trenched gate runner 222 can have a shape different from that shown in FIG. 2. For example, one or more of the floating-field implants from the set of floating-field implants 212 and/or the trenched gate runner 222 can have more or less curves than shown in FIG. 2. In some embodiments, one or more of the floating-field implants 212 and/or the trenched gate runner 222 can have a square shape, a circular shape, a rectangular shape, an oval shape, and/or so forth.

Although not shown in FIG. 2, in some embodiments, one or more floating-field implants from the set of floating-field implants 212 and/or the trenched gate runner 222 may form an open structure. In other words, one or more floating-field implants from the set of floating-field implants 212 and/or the trenched gate runner 222 may not form a closed loop or ring as shown in FIG. 2.

As shown in FIG. 2, each floating-field implant from the set of floating-field implants 212 is equally spaced from an adjacent floating-field implants from the set of floating-field implants 212. In some embodiments, each pair of floating-field implants from the set of floating-field implants 212 may have different spacing (e.g., may not be equally spaced). For example, a distance between the floating-field implant FF1 and the floating-field implant FF2 may be different than a distance between the floating-field implant FF2 and the floating-field implant FF3. In some embodiments, the distance between a pair of the floating-field implants 212 (e.g., floating-field implant FF1 and floating-field implant FF2, floating-field implant FF1 and floating-field implant FF3) can be approximately between a few nanometers (nm) (e.g., 1 nm, 2 nm, 10 nm) and several micrometers (μm) (e.g., 2 μm, 10 μm, 100 μm). In some embodiments, the distance can be less than a few nanometers or greater than several micrometers.

In some embodiments, a distance between the trenched gate runner 222 and the floating-field implant FF3, which is the innermost of the set of floating-field implants 212, can be different than (e.g., greater than, less than) or the same as a distance between a pair of floating-field implants from the set of floating-field implants 212. For example, a distance between the trenched gate runner 222 and the floating-field implant FF3, which is the innermost of the set of floating-field implants 212, can be the same as a distance between the floating-field implant FF3 and the floating-field implant FF2. In some embodiments, the distance between the trenched gate runner 222 and the floating-field implants 212 (e.g., floating-field implant FF3) can be approximately between a few nanometers (nm) (e.g., 2 nm, 10 nm) and several micrometers (μm) (e.g., 2 μm, 10 μm, 100 μm). In some embodiments, the distance can be less than a few nanometers or greater than several micrometers.

FIGS. 3A through 3E are cross-sectional diagrams that illustrate a method for producing a semiconductor die 300 including floating-field implants and a trenched gate runner (e.g., a gate runner having at least a portion disposed within a trench (i.e., a gate-runner trench)). In FIGS. 3A through 3E, various operations (e.g., semiconductor processing operations) are performed within an epitaxial layer 390, which is disposed on a substrate 320, to produce the floating-field implants and a trenched gate runner in the semiconductor die 300. In some embodiments, the substrate 320 can be an N-type substrate doped with an N-type dopant (e.g., a relatively high concentration of an N-type dopant, a phosphorus dopant, an arsenic dopant). In some embodiments, the epitaxial layer 390, which is formed over the substrate 320, can be a P-type material made of the same conductivity or different conductivity than the substrate 320. In some embodiments, the epitaxial layer 390 can be epitaxially grown on the substrate 320. In some embodiments, the epitaxial layer 390 can be considered a portion of the substrate 320.

The processing used to form the floating-field implants and the trenched gate runner can be integrated with processes used to form one or more active devices (e.g., active semiconductor devices such as the MOSFET device). In other words, at least some portions of the trenched gate runners and the floating-field implants can be formed using the same processes used to form one or more active devices. An active device 380 is identified in FIGS. 3D and 3E. In some embodiments, the conductivity types described in FIGS. 3A through 3E can be reversed. Accordingly, the active device 380 (identified in FIGS. 3D and 3E) can be, for example, can be N-type MOSFET devices, P-type MOSFET devices, and so forth. In some embodiments, the semiconductor die 300 can have many active devices, such as active device 380, which can be laterally oriented with respect to one another, dispersed throughout the active region of the die in a predefined pattern, and/or so forth.

FIGS. 3A through 3E are simplified diagrams that illustrate only some of the steps (e.g., process steps) to produce the semiconductor die 300 with the floating-field implants and the trenched gate runner. In some embodiments, additional semiconductor processing operations (e.g., masking steps, etching steps, deposition steps, polishing steps) that are not explicitly shown can be used to produce the semiconductor die 300 with the floating-field implants and the trenched gate runner. For simplicity, numerals are shown on only some portions of elements of the semiconductor die 300 even though some elements may extend to other portions of the semiconductor die 300 in FIGS. 3A through 3E. The processing steps shown in FIGS. 3A through 3E are representative examples of a types of processing steps that can be used to produce the semiconductor die 300. Accordingly, in some embodiments one or more processing steps can be performed in a different order, or can be replaced with other types of processing steps. Some variations in the process are described herein.

Figure 3A:
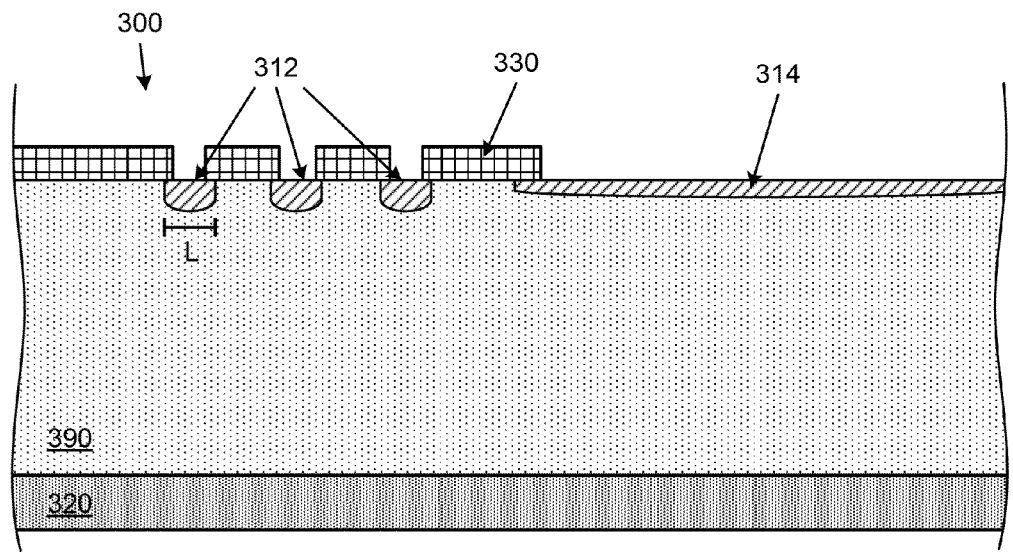
FIGS. 3A through 3E are cross-sectional diagrams that illustrate a method for producing a semiconductor die including floating-field implants and a trenched gate runner.

As shown in FIG. 3A, which illustrates a cross section of the semiconductor die 300 being fabricated, a field oxide layer 330 is disposed on the epitaxial layer 390. In this figure, openings have been etched (e.g., etched using a wet etch process, etched using a gaseous etchant, etched using a plasma process) into the field oxide layer 330 so that an active area implant 314 and floating-field implants 312 can be formed within the epitaxial layer 390 using an implantation process (e.g., an implant process). The active area implant 314 can be an implant related to (e.g., implanted for) one or more active devices (e.g., semiconductor devices).

As shown in FIG. 3A, in some embodiments, the active area implant 314 and/or floating-field implants 312 can extend under the portions of the field oxide 330 due to diffusion of the dopant(s) during or after the implantation process. In some embodiments, the active area implant 314 and/or the floating-field implants 312 can be formed using a P-type dopant (e.g., a gallium dopant, a boron dopant) so that these implants are P-well implants.

In some embodiments, the field oxide layer 330 can be formed using a deposited oxide and/or a thermally grown oxide. In some embodiments, the field oxide layer 330 can have a thickness between a few nanometers (nm) (e.g., 2 nm, 10 nm) and several micrometers (μm) (e.g., 2 μm, 10 μm, 100 μm). In some embodiments, the thickness can be less than a few nanometers or greater than several micrometers. In some embodiments, at least a portion of the field oxide 330 can be formed using a chemical vapor deposition (CVD) process (e.g., a sub-atmospheric CVD (SACVD) process). In some embodiments, other types of deposition processes can be used.

In some embodiments, the openings in the field oxide layer 330 associated with the floating-field implants 312 and the opening in the field oxide layer 330 associated with the active area implant 314 can be formed using the same etching process. In some embodiments, the openings in the field oxide layer 330 associated with the floating-field implants 312 can be formed for the openings in the field oxide layer 330 associated the active area implant 314, or vice versa. In such embodiments, the openings and field oxide layer 330 associated with the floating-field implants 312 can be formed using a process (or processes) that is different than a process (or processes) used to form the openings in the field oxide layer 330 associate the active area implant 314. For example, one of the openings associated with the floating-field implants 312 can be formed using a process that is the same as a process used to form the opening in the field oxide layer 330 associate the active area implant 314. In such embodiments, another of the openings associated with the floating-field implants 312 can be formed using a different process.

In this embodiment, the active area implant 314 and the floating-field implants 312 can be formed using different (or multiple) implant processes. For example, the active area implant 314 can be formed using an implant process that has an energy (e.g., an acceleration energy), a duration of implantation, a dopant type, a dopant dose, an angle of implantation (e.g., an angle between 0 and 70 degrees with respect to a vertical axis (orthogonal to the semiconductor die 600)) and/or so forth that is different than that used to form one or more of the floating-field implants 312. In some embodiments, the active area implant 314 and/or one or more of the floating-field implants 312 can be formed using multiple implant processes (e.g., formed using multiple implant processes that are performed in a serial fashion). For example, one of the floating-field implants 312 can be formed using a process that is the same as a process used to form the active area implant 314. In such embodiments, another of the floating-field implants 312 can be formed using a different (and separate) process.

In this embodiment, the openings associated with the floating-field implants 312 can be formed in the field oxide layer 330. The floating-field implants 312 shown in FIG. 3A can be at least partially formed via the openings associated with the floating-field implants 312 using an implant process (e.g., an initial or first implant process (or processes)). After the floating-field implants 312 have been at least partially formed, the opening associated with the active area implant 314 can be formed in the field oxide layer 330. The active area implant 314 can then be formed via the opening associated with the active area implant 314 using an implant process (e.g., an additional or second implant process (or processes)). In some embodiments, the floating-field implants 312 can continue to be formed (e.g., doped) via the openings associated with the floating-field implants 312 during the implant process (e.g., the additional or second implant process (or processes)) used to form the active area implant 314 via the opening associated with the active area implant 314. Because the active area implant 314 and the floating-field implants 312 can be formed, at least in part, using the same implant process, portions of one or more active devices of the semiconductor die 300 can be formed in an integral fashion with portions of the floating-field implants 312.

As shown in FIG. 3A, the floating-field implants 312 have a depth that is greater than a depth of the active area implant 314 (because the floating field implants 312 are also implanted by the additional implant process used to form the active area implant 314). In some embodiments, the floating-field implants 312 can have a depth that is approximately the same as a depth of the active area implant 314.

In some embodiments, the active area implant 314 and the floating-field implants 312 can be formed using the same implant process (or processes). Because the active area implant 314 and the floating-field implants 312 can be formed using the same implant process, portions of one or more active devices of the semiconductor die 300 can be formed in an integral fashion with portions of the floating-field implants 312. In some embodiments, the active area implant 314 can be formed (via one or more openings in the field oxide layer 330) before the floating-field implants 312 are formed (via one or more openings in the field oxide layer 330).

In some embodiments, an implant process (e.g., an implant angle, a dopant type, a dopant dose, etc.) used to form one of the floating-field implants 312 can be different than an implant process used to form another of the floating-field implants 312. For example, a concentration (e.g., a dopant concentration) and/or a depth of one of the floating-field implants 312 can be different than a concentration (e.g., a dopant concentration) and or a depth of another of the floating-field implants 312.

In some embodiments, one or more of the floating-field implants 312 can have a width (which can be correlated to or proportional to the openings etched within the field oxide 330) that can be between a few micrometers (e.g., 1 µm, 10 µm, 50 µm) and hundreds of micrometers (e.g., 100 µm, 300 µm, 1000 µm). A width L for one of the floating-field implants 312 is shown in FIG. 3A. In some embodiments, a width of one or more of the floating-field implants 312 can be less than a few micrometers or greater than several micrometers. Although not shown in FIG. 3A, in some embodiments, one of the floating-field implants 312 can have a width that is different than a width of another of the floating-field implants 312. In some embodiments, a distance (e.g., a spacing) between pairs of adjacent floating-field implants 312 can be the same or can be different.

In this embodiment, the floating-field implants 312 include three floating-field implants 212. In some embodiments, the floating-field implants 312 can include less than three floating-field implants or more than three floating-field implants.

Figure 3B:
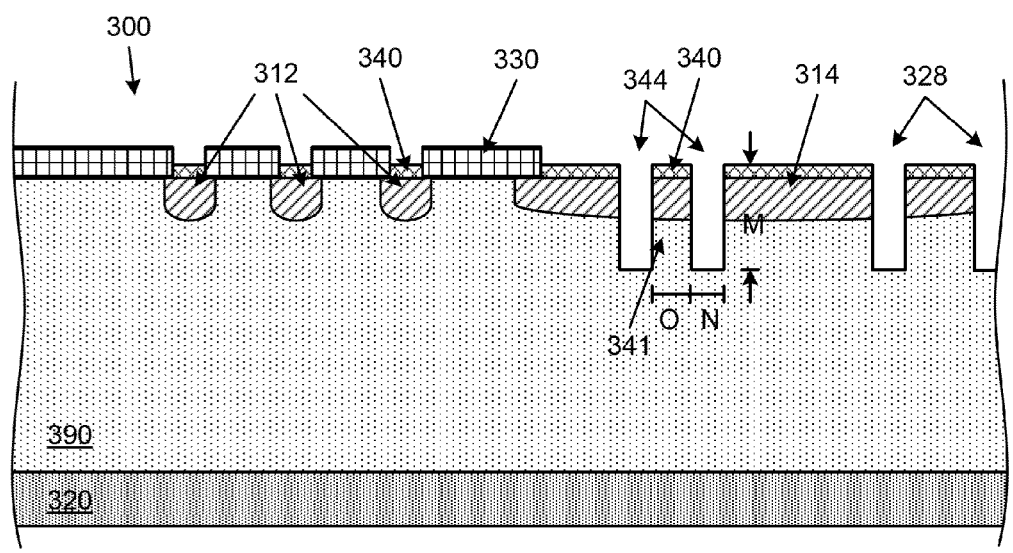

FIG. 3B is a diagram that illustrates gate-runner trenches 344 and device trenches 328 formed within the epitaxial layer 390. The gate-runner trenches 344 and the device trenches 328 can be formed within the epitaxial layer 390 using one or more trench mask (e.g., photoresist masking, photoresist stripping) and/or trench etch processes. As shown in FIG. 3B, the gate-runner trenches 344 and the device trenches 328 are formed within the active area implant 314. The device trenches 328 can be for one or more active devices (e.g., MOSFET devices) to be formed within the semiconductor die 300.

In some embodiments, the gate-runner trenches 344 and the device trenches 328 can be formed using the same trench mask and/or trench etch processes. Because the gate-runner trenches 344 and the device trenches 328 can be formed using the same trench etch process, portions of one or more active devices of the semiconductor die 300 can be formed in an integral fashion with portions of the gate-runner trenches 344.

In this embodiment, two gate-runner trenches are included in the gate-runner trenches 344. The gate-runner trenches 344 are disposed (e.g., disposed laterally) between the device trenches 328 and the floating-field implants 312. In some embodiments, more than two gate-runner trenches or less than two gate-runner trenches can be included in the gate-runner trenches 344.

In some embodiments, the trench etch process can be a wet etch process, a dry etch process, etched using a gaseous etchant, a plasma etch, and/or so forth. In some embodiments, the etching process used to define the trench 305 can be a selective etching process. In some embodiments, a mesa region 341 can be defined when the gate-runner trenches 344 are formed. In some embodiments, the mesa region 341 (which can be correlated to a distance between the gate-runner trenches 344) can have a width O that can range approximately between 0.01 micrometers and several micrometers (e.g., 1 µm, 10 µm, 50 µm). In some embodiments, the mesa region 341 can have the width that is less than 0.1 micrometers or greater than several micrometers.

The gate-runner trenches 344, which are approximately the same dimensions (e.g., which have approximately the same size or aspect ratios) in this embodiment, can have a width that can range approximately between 0.01 micrometers and several micrometers (e.g., 1 µm, 10 µm, 50 µm). The gate-runner trenches 344 can have a depth that can be approximately a few micrometers (e.g., 1 µm, 10 µm, 50 µm). In some embodiments, the gate-runner trenches can have the depth that is less than a few micrometers or greater than a few micrometers. A width N and a depth M of one of the gate-runner trenches 344 are shown in FIG. 3B.

In some embodiments, each of the gate-runner trenches 344 can have a different depth and/or a different width. For example, one of the gate-runner trenches 344 can have a width that is greater than a width of another of the gate-runner trenches 344. In some embodiments, one of the gate-runner trenches 344 can have a depth that is greater than a depth of another of the gate-runner trenches 344. In other words, the aspect ratios of the gate-runner trenches 344 can be different. In some embodiments, one or more of the gate-runner trenches 344 can have dimensions that are different than dimensions of one or more of the active trenches 328. In some embodiments, each of the gate-runner trenches 344 can have a depth and/or a width different than a depth and/or a width of one or more of the device trenches 328.

In this embodiment, the gate-runner trenches 344 and the device trenches 328 are formed within the epitaxial layer 390 after the floating-field implants 312 and the active area implant 314 have been diffused further (e.g., deeper) into the epitaxial layer 390 during a diffusion process. In some embodiments, the floating-field implants 312 and/or the active area implant 314 can be diffused through a relatively high temperature heating process.

In some embodiments, the gate-runner trenches 344 and/or the device trenches 328 can be formed at different times (with respect to other features) than shown in FIGS. 3A and 3B. For example, in some embodiments, the floating-field implants 312 can be formed via openings within the field oxide layer 330 associated with the floating-field implants 312 via an implant process (e.g., an initial or first implant process). The gate-runner trenches 344 and/or the device trenches 328 can then be formed (at least in part) within the epitaxial layer 390 (and via the field oxide layer 330). Subsequent to the formation of the gate-runner trenches 344 and/or the device trenches 328, an opening in the field oxide layer 330 can be formed so that the active area implant 314 can be formed via an implant process (e.g., an additional or second implant process). If the gate-runner trenches 344 and/or the device trenches 328 are not formed before the active area implant 314 is formed, the remaining trench(es) can be formed after active area implant 314 is formed.

In some embodiments, the gate-runner trenches 344 and/or the device trenches 328 can be formed in the epitaxial layer 390 before the floating-field implants 312 and the active area implant 314 are formed. After the gate-runner trenches 344 and/or the device trenches 328 have been formed (at least in part) within the epitaxial layer 390, the floating-field implants 312 and/or the active area implant 314 can be formed via openings formed within the field oxide layer 330 at different times (using separate processes) and/or using the same or different (e.g., separate) implant processes.

As shown in FIG. 3B, a sacrificial gate oxide 340 is disposed over the implants. Specifically, at least a portion of the sacrificial gate oxide 340 is disposed on each of the floating-field implants 312 and on portions of the active area implant 314. In some embodiments, the sacrificial gate oxide 340 can be formed using any combination of thermally grown oxide or deposited oxide. The sacrificial gate oxide 340 is shown in FIG. 3B after portions of the sacrificial gate oxide 340 have been removed using an etch process (e.g., a wet etch process). In some embodiments, although not shown in FIG. 3B, portions of the sacrificial gate oxide 340 may be deposited on (or remain on) the field oxide 330 (and included in the thickness of the field oxide 330). The sacrificial gate oxide 340 can have a thickness between a few nanometers (nm) (e.g., 2 nm, 10 nm) and several micrometers (μm) (e.g., 2 μm, 10 μm, 100 μm). In some embodiments, the thickness can be less than a few nanometers or greater than several micrometers.

In some embodiments, the oxides (e.g., the field oxide 330, the sacrificial gate oxide 340) described herein can be formed using the same or different processes. In some embodiments, a flow/reflow process can be used to flow the field oxide 330 and/or the sacrificial gate oxide 340, which can reduce voids and/or defects. In some embodiments, an etch process can be used to remove excess of the field oxide 330 and/or sacrificial gate oxide 340. In some embodiments, a planarization process, such as a chemical and/or mechanical polishing process, can be used in addition to (whether before or after), or instead of, the etch process. In some embodiments, the field oxide 330 and/or the sacrificial gate oxide 340 can include, or can be replaced with any insulating or semi-insulating materials such as a nitride-based material.

In some embodiments, before portions of the sacrificial gate oxide 340 are removed using an etch process, various optional implant processes related to active devices to be formed within the semiconductor die 300 can be performed. For example, implants related to a junction field-effect transistor (JFET) device, a MOSFET device, or other type of device (e.g., trench type device, non-trench type device) can be optionally formed within the epitaxial layer 390 before portions of the sacrificial gate oxide 340 are removed using an etch process.

Figure 3C:
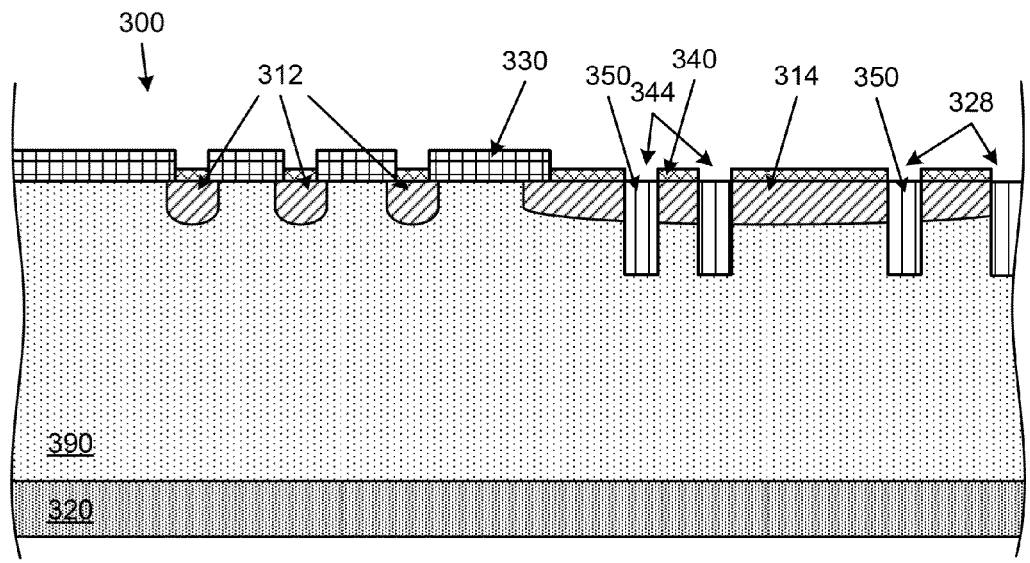

FIG. 3C is a diagram that illustrates the semiconductor die 300 after a polysilicon deposition and polysilicon etch process have been performed. As shown in FIG. 3C, polysilicon 350 (e.g., a doped polysilicon material) (or another type of electrically conductive material such as a metal, a silicide, a semiconducting material, a doped polysilicon) is disposed within the gate-runner trenches 344 and device trenches 328. In some embodiments, the polysilicon 350 can be formed by a deposition process such as, for example, a chemical vapor deposition (CVD) process, a plasma-enhanced CVD (PECVD) process, a low pressure CVD (LPCVD) process, and/or so forth. In some embodiments, a material different than the polysilicon 350 (or in addition to the polysilicon 350) can be disposed within the gate-runner trenches 344 and/or the device trenches 328. In some embodiments, the polysilicon 350 can be deposited within one or more of the gate-runner trenches 344 and/or one or more of the device trenches 328 during different time periods (e.g., using separate processes).

Figure 3D:
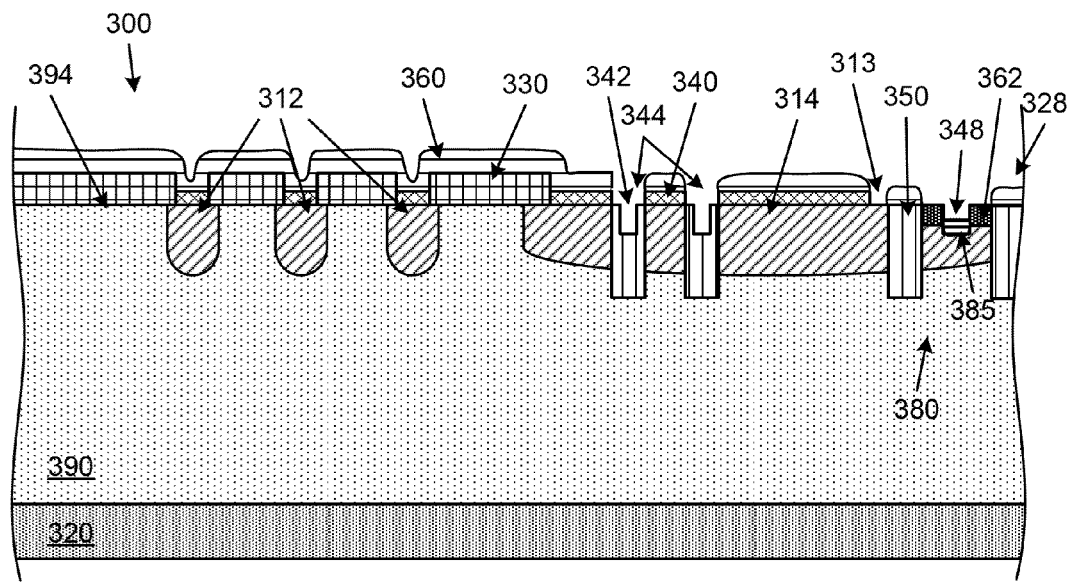

After the polysilicon 350 has been deposited in the gate-runner trenches 344 and the device trenches 328, a source implant 362 can be formed as part of an active device 380 as shown in FIG. 3D. In some embodiments, the source implant 362 can be formed using an implant process (e.g., an implantation process, a dopant implant process). In some embodiments, the implant process can be similar to one or more of the implant processes described above.

The source implant 362 can be processed during a source diffusion process. In some embodiments, the source implant 362 can be further diffused into the epitaxial layer 390 by heating the semiconductor die 300 during the source diffusion process. In some embodiments, the floating-field implants 312 and/or the active area implant 314 can be further diffused into the epitaxial layer 390 during the source diffusion process.

As shown in FIG. 3D, an insulating layer 360 can be disposed on the semiconductor die 300. In some embodiments, the insulating layer 360 can be a dielectric material including borophosphosilicate glass (BPSG), phosphosilicate glass (PSG), or borosilicate glass (BSG) materials. In some embodiments, the insulating layer 360 can be deposited using a CVD process (or derivative thereof) until the desired thickness is obtained. In some embodiments, the insulating layer 360 can be flowed (and reflowed) during a flow process.

In some embodiments, the insulating layer 360 can be formed (e.g., masked, etched) so that features formed prior to the deposition of the insulating layer 360 can remain exposed. For example, as shown in FIG. 3D, the insulating layer 360 can be formed so that the gate-runner trenches 344, portions of the active device 380, and at least a portion 313 of the active area implant 314 are exposed (e.g., not covered by the insulating layer 360). In some embodiments, the insulating layer 360 can be formed, at least in part, using a plasma etch oxide process.

Figure 4:
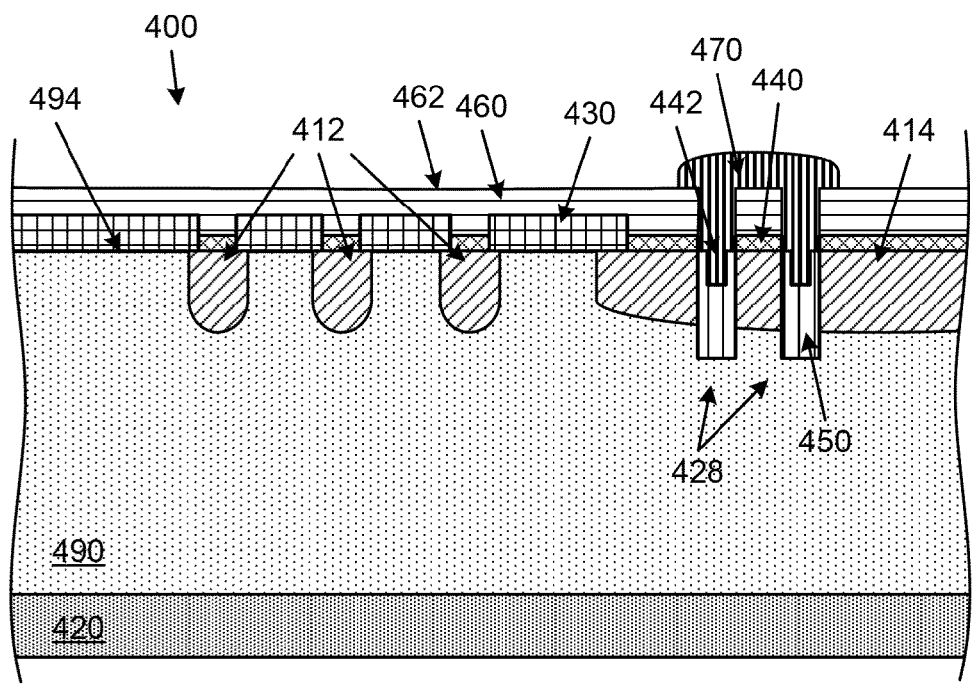
FIG. 4 is a cross-sectional diagram that illustrates a semiconductor die including an insulating layer that has been polished.

Although not shown in FIG. 3D, in some embodiments, the insulating layer 360 can be chemically and/or mechanically polished (CMP) so that the insulating layer 360 has a substantially flat top surface. In other words, the insulating layer 360 can be chemically and/or mechanically polished so that a top surface of the insulating layer 360 is disposed substantially within a plane that is substantially aligned with a top surface 394 of the epitaxial layer 390. An example of a semiconductor die that includes a chemically and mechanically polished insulating layer is shown in FIG. 4.

As shown in FIG. 3D, recesses 342 (e.g., recessed portions) are formed within the polysilicon 350 disposed within the gate-runner trenches 344. In some embodiments, the recesses 342 can be etched using one or more etch processes such as a plasma etch process. In some embodiments, the recesses 342 can be formed within the polysilicon 350 so that materials (e.g., conductive material 370) deposited on the polysilicon 350 can adhere to additional surface area and/or structure defined by the recesses 342 that would otherwise not exist if the recesses 342 were not formed. In some embodiments, each of the recesses 342 can be referred to as a dimple, and a process used to form each of the recesses 342 can be referred to as a dimple etch.

As shown in FIG. 3D, an implant 385 can be formed in the active device 380. In some embodiments, the implant 385 can be formed in the active device 380 after the plasma etch used to form the recesses 342. In some embodiments, the implant 385 can be a P-type implant (e.g., a P+ implant).

Figure 5:
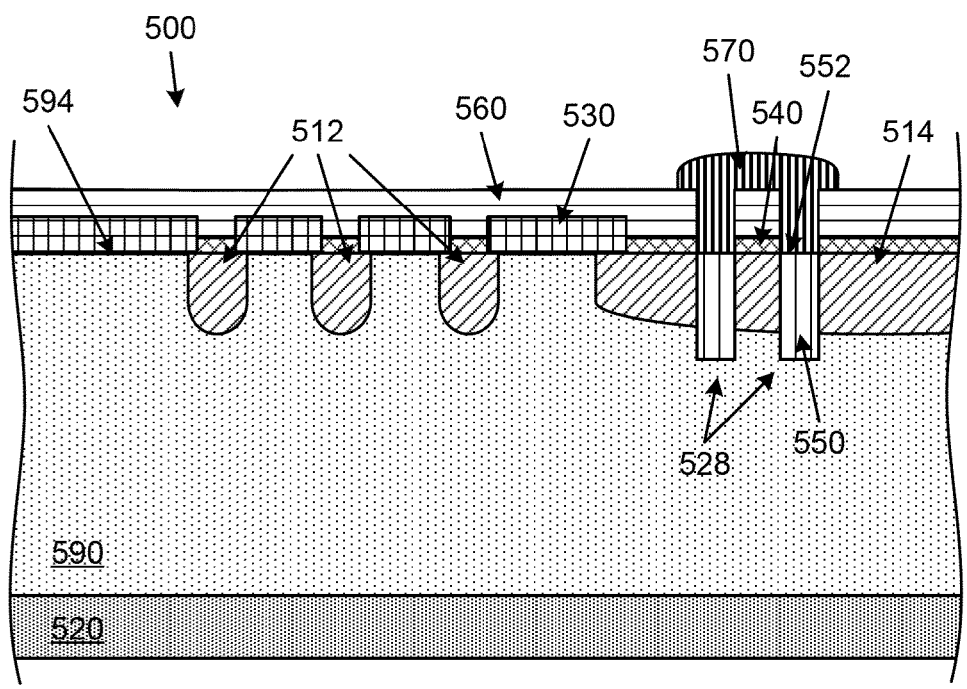
FIG. 5 is a cross-sectional diagram that illustrates another semiconductor die that has an insulating layer that has been polished.

Although not shown in FIG. 3D, in some embodiments, one or more of the recesses 342 may not be formed within the polysilicon 350 disposed within the gate-runner trenches 344. For example, recesses may not be formed in the polysilicon 350 disposed within either of the gate-runner trenches 344. As another example, a recess may be formed in the polysilicon 350 disposed within only one of (or less than all of) the gate-runner trenches 344. Accordingly, the polysilicon 350 disposed within one or more of the gate-runner trenches 344 may have a substantially flat top surface that can be substantially aligned with the top surface 394 of the epitaxial layer 390. An example of a semiconductor die that includes a gate runner without recesses in polysilicon disposed within gate-runner trenches is shown in FIG. 5.

In some embodiments, an etch process used to form the recesses 342 can also be used to form a recess 348 in a portion of the active device 380. Accordingly, the active device 380 can be processed in an integral fashion with the recesses 342 associated with the gate-runner trenches 344. In some embodiments, the recess 348 associated with the active device 380 can be formed using a process (e.g., an etch process) that is separate from a process used to form one or more of the recesses 342. For example, the recess 348 associated with the active device 380 and one of the recesses 342 can be formed using the same process. Another of the recesses 342 can be formed using a different process.

In some embodiments, the recesses 342 can have a shape that is different than that shown in FIG. 3D. In some embodiments, one or more of the recesses 342 can have a depth that is a fraction of a depth of the gate-runner trenches 344. In some embodiments, one or more of the recesses 342 can have a depth that is less than or more than one-half of a depth of one or more of the gate-runner trenches 344. In some embodiments, one or more of the recesses 342 can have a width that is less than or more than one-half of a width of one or more of the gate-runner trenches 344. In some embodiments, one or more of the recesses 342 can have an aspect ratio that is different than an aspect ratio of one or more of the gate-runner trenches 344 (and/or the recess 348 associated with the active device 380).

In some embodiments, one or more of the recesses 342 when viewed from the side (as shown in FIG. 3D) can have a different profile than shown in FIG. 3D, such as a rounded outer profile. In some embodiments, one or more of the recesses 342 when viewed from above (not shown) can have a square outer profile, a circular outer profile, a rectangular outer profile and/or so forth.

As shown in FIG. 3D, the polysilicon 350 disposed within one or more of the gate-runner trenches 344 may have a top surface (e.g., an entire top surface) disposed below the top surface 394 of the epitaxial layer 390. In other words, the polysilicon 350 disposed within one or more of the gate-runner trenches 344 can have a top surface (e.g., an entire top surface) disposed below the field oxide layer 340 (e.g., below a plane aligned along a bottom surface of the field oxide layer 340). Although not shown, in some embodiments, the polysilicon 350 disposed within one or more of the gate-runner trenches 344 can have at least a portion with a top surface disposed above the top surface 394 of the epitaxial layer 390 and below a top surface of the field oxide layer 340. In some embodiments, the polysilicon 350 disposed within one or more of the gate-runner trenches 344 can have at least a portion with a top surface disposed above a top surface of the field oxide layer 340.

Figure 3E:
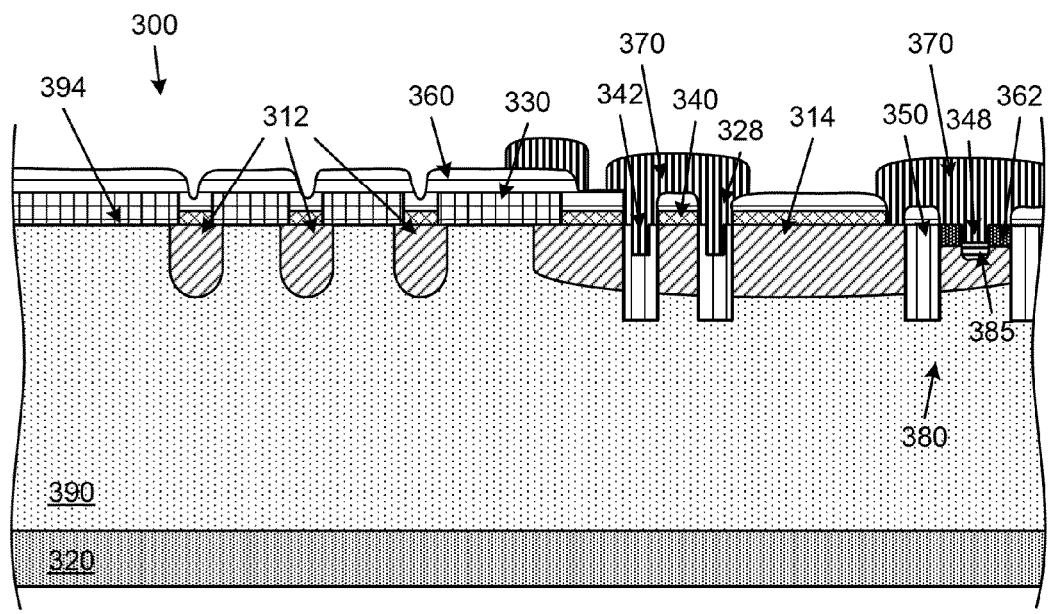

As shown in FIG. 3E, a conductive material 370 is deposited on portions of the semiconductor die 300. Specifically, portions of the conductive material 370 are deposited over the gate-runner trenches 344, the active device 380, and over other portions of the insulating layer 360. In some embodiments, the conductive material 370 can be, for example, a metal, a silicide, a semiconducting material, a doped polysilicon, and/or combinations thereof. In some embodiments, the formation of the conductive material 370 can include depositing, for example, a barrier layer (e.g., a barrier metal layer) (not shown). In some embodiments, the conductive material 370 (and/or a barrier layer) can be formed by a deposition process such as, for example, a CVD process, a PECVD process, a LPCVD process, and/or sputtering processes using a metal as a sputtering target. In some embodiments, the portions of the conductive material 370 can be formed, at least in part, using in etched process (e.g., etched using a metal etch process).

As shown in FIG. 3E, the conductive material 370 disposed over the gate-runner trenches 344 defines a gate runner. The gate runner, in this embodiment, electrically couples the polysilicon 350 disposed within both of the gate-runner trenches 344. In embodiments where more than two gate-runner trenches are formed, a conductive material can be configured to define a gate runner that electrically couples material disposed within all of the gate-runner trenches.

As shown in FIG. 3E, the conductive material 370 has a first portion disposed over the gate-runner trenches 344 and the conductive material 370 has a second portion disposed over the active device 380. The first portion and the second portion of the conductive material 370 are disposed approximately within the same plane (not shown). Specifically, a top surface of the first portion of the conductive material 370 and a top surface of the second portion of the conductive material 370 are aligned (e.g., substantially aligned) within a plane that is substantially parallel to the top surface 394 of the epitaxial layer 390.

Although not shown in FIG. 3E, the passivation layer (not shown). Can be deposited on the semiconductor die 300 after the conductive material 370 has been formed on the semiconductor die 300. In some embodiments, the passivation layer can be etched. In some embodiments, because the conductive material 370 disposed over the gate-runner trenches 344 and the conductive material 370 disposed over the active device 380 have approximately the same elevation above the top surface 394 of the epitaxial layer 390, a passivation layer disposed on the semiconductor die 300 may be relatively robust (in a desirable fashion) against cracking.

In some embodiments, various types of contacts (e.g., contact portions) can be formed for contacting one or more portions of the semiconductor die 300. In some embodiments, a drain can be formed on the bottom of the substrate 320. In some embodiments, the drain can be formed before or after one or more contact regions are formed above the semiconductor die 300. In some embodiments, the drain can be formed on the backside by thinning the backside of the substrate 320 using processes such as grinding, polishing, and/or etching. In some embodiments, a conductive layer can be deposited on the backside of the substrate 320 until the desired thickness of the conductive layer of the drain is formed.

In some embodiments, one or more types of semiconductor substrates can be used to produce the semiconductor die 300 shown in FIGS. 3A through 3E. Some examples of substrates that can be used include, but are not limited to, silicon wafers, epitaxial Si layers, bonded wafers such as used in silicon-on-insulator (SOI) technologies, and/or amorphous silicon layers, all of which may be doped or undoped. Also, in some embodiments, other semiconductor materials that can be used can include SiGe, Ge, Si, SiC, GaAs, GaN, $In_xGa_yAs_z$, $Al_xGa_yAs_z$, $Al_xGa_yN_z$, and/or so forth.

FIG. 4 is a cross-sectional diagram that illustrates a semiconductor die 400 including an insulating layer 460 that has been polished. The insulating layer 460 can be chemically and/or mechanically polished so that the insulating layer 460 has a top surface 462 that is flat (or substantially flat). In other words, the insulating layer 460 can be chemically and/or mechanically polished so that the top surface 462 of the insulating layer 460 is disposed substantially within a plane that is substantially aligned with a top surface 494 of the epitaxial layer 490.

In this embodiment, recesses 442 are formed within polysilicon 450 (or another type of conducting material) within gate-runner trenches 428. The recesses 442 can be formed within the polysilicon 450 so conductive material 470 deposited on the polysilicon 450 can adhere to the additional surface area defined by the recesses 442 that would otherwise not exist if the recesses 442 were not formed. Although not shown in FIG. 4, in some embodiments, an active device can be formed within the semiconductor die 400. Floating-field implants 412 are shown in an epitaxial layer 490 of the semiconductor die 400, and a field oxide 430 and a sacrificial oxide 440 are also shown in FIG. 4.

FIG. 5 is a cross-sectional diagram that illustrates another semiconductor die 500 including insulating layer 560 that has been polished. The insulating layer 560 can be chemically and/or mechanically polished so that the insulating layer 560 has a top surface 562 that is flat (or substantially flat). In other words, the insulating layer 560 can be chemically and/or mechanically polished so that the top surface 562 of the insulating layer 560 is disposed substantially within a plane that is substantially aligned with a top surface 594 of the epitaxial layer 590.

In this embodiment, a top surface 552 of polysilicon 550 disposed within gate-runner trenches 528 is aligned within (or substantially aligned within) or disposed within the top surface 594 of the epitaxial layer 590. Floating-field implants 512 are shown in an epitaxial layer 590 of the semiconductor die 500. The field oxide 530 and a sacrificial oxide 540 are also shown in FIG. 5. Although not shown in FIG. 5, in some embodiments, an active device can be formed within the semiconductor die 500.

Figure 6:
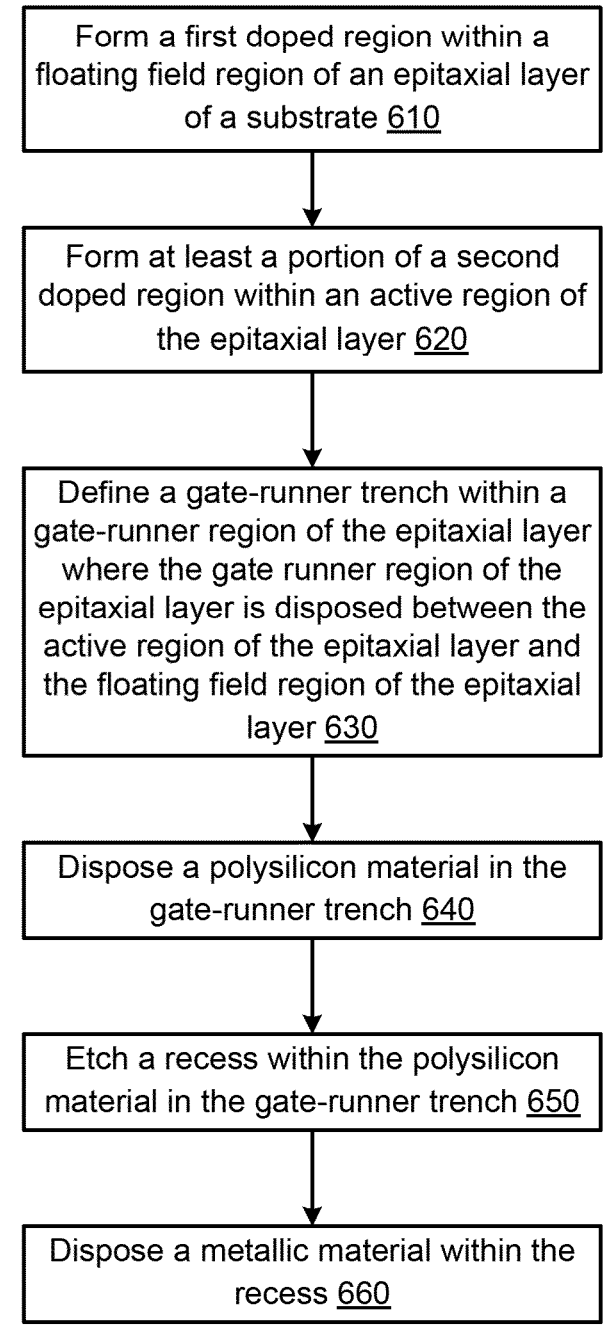
FIG. 6 is a diagram that illustrates a process for forming a gate-runner trench and various doped regions of a semiconductor die.

FIG. 6 is a diagram that illustrates a process for forming a gate-runner trench and various doped regions of a semiconductor die. As shown in FIG. 6, a first doped region is formed within a floating-field region of an epitaxial layer of a substrate (block 610). The first doped region within the floating-field region can be a floating-field implant configured to function as a portion of a termination of the semiconductor die. In some embodiments, multiple floating-field implants can be formed within the floating-field region.

At least a portion of a second doped region is formed within an active region of the epitaxial layer (block 620). The second doped region can function as a portion of an active device (e.g., a semiconductor device) within the active region. In some embodiments, the first doped region and the second doped region can be formed using the same implant process.

A gate-runner trench is defined within a gate runner region of the epitaxial layer where the gate-runner region of the epitaxial layer is disposed between the active region of the epitaxial layer and the floating-field region of the epitaxial layer (block 630). In some embodiments, the gate-runner trench can be defined within the gate-runner region using a trench process also use perform at least a portion of an active device within the active region. In some embodiments, multiple gate-runner trenches can be formed within the semiconductor die.

A polysilicon material is disposed in the gate-runner trench (block 640). In some embodiments, the polysilicon material can be disposed within the gate-runner trench using a process also used to deposit polysilicon material within an active device formed within the active region.

A recess is etched within the polysilicon material in the gate-runner trench (block 650). In some embodiments, recesses can be formed within the polysilicon of more than one gate-runner trench if multiple gate-runner trenches are formed within the semiconductor die.

A metallic material is disposed within the recess (block 660). In some embodiments, the metallic material can be disposed within multiple recesses formed within the polysilicon of multiple gate-runner trenches.

Implementations of the various techniques described herein may be implemented in digital electronic circuitry, or in computer hardware, firmware, software, or in combinations of them. Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a plurality of trench metal-oxide-semiconductor field effect transistors (MOSFET) devices formed within an epitaxial layer of a substrate;
a gate-runner trench disposed around the plurality of trench MOSFET devices and disposed within the epitaxial layer, the gate-runner trench being continuous;
a floating-field implant defined by a well implant and disposed around the gate-runner trench, the floating-field implant having a bottom interface and at least one side interface in direct contact with the epitaxial layer, the floating-field implant defining a pn-junction with the epitaxial layer; and
a polysilicon material disposed within the gate-runner trench and at least one device trench of the plurality of trench MOSFET devices, the polysilicon material being in contact with the epitaxial layer and an active area implant that is disposed in the substrate.

2. The apparatus of claim 1, wherein the floating-field implant is a first floating-field implant and the well implant is a first well implant,
the apparatus further comprising:
a second floating-field implant defined by a second well implant, the second floating-field implant being disposed around the gate-runner trench and around the first floating-field implant.

3. The apparatus of claim 1, wherein the polysilicon material includes a recessed portion, the apparatus further comprising:
a metallic material disposed within the recessed portion of the polysilicon material.

4. The apparatus of claim 1, wherein the gate-runner trench is a first gate-runner trench,
the apparatus further comprising:
a second gate-runner trench disposed around the plurality of trench MOSFET devices; and
a metallic material disposed over the first gate-runner trench and the second gate-runner trench.

5. The apparatus of claim 1, wherein the gate-runner trench is a first gate-runner trench,
the apparatus further comprising:
a second gate-runner trench disposed around the plurality of trench MOSFET devices; and
a metallic material configured to electrically couple a first conductive material disposed within the first gate-runner trench and a second conductive material disposed within the second gate-runner trench.

6. The apparatus of claim 1, wherein the gate-runner trench and the floating-field implant collectively function as a termination for an edge trench MOSFET device from the plurality of trench MOSFET devices.

7. The apparatus of claim 1, further comprising:
a gate electrode coupled to a trench MOSFET device from the plurality of trench MOSFET devices; and
an electrically conductive material disposed within the gate-runner trench and electrically coupled to the gate electrode.

8. An apparatus, comprising:
a plurality of trench semiconductor devices formed within an epitaxial layer of a substrate;
a gate-runner trench disposed around the plurality of trench semiconductor devices and disposed within the epitaxial layer, the gate-runner trench being continuous and completely surrounding the plurality of trench semiconductor devices;
a polysilicon material disposed within the gate-runner trench and at least one device trench of the plurality of trench semiconductor devices, the polysilicon material having a recessed portion in the gate runner trench and being in contact with the epitaxial layer and an active area implant that is disposed in the substrate.

9. The apparatus of claim 8, further comprising:
a metallic material disposed within the recessed portion of the polysilicon material, the metallic material defining a gate runner.

10. The apparatus of claim 8, further comprising:
a floating-field implant defined by a well implant and disposed around the gate-runner trench.

11. The apparatus of claim 8, further comprising:
a plurality of floating-field implants each defined by a well implant and each disposed around the gate-runner trench.

12. The apparatus of claim 8, wherein the gate-runner trench is first gate-runner trench,
the apparatus further comprising:
a second gate-runner trench disposed around the plurality of trench semiconductor devices; and
a metallic material disposed over the first gate-runner trench and the second gate-runner trench.

13. The apparatus of claim 8, further comprising:
a device trench included in a trench MOSFET device from the plurality of trench MOSFET devices, the device trench having at least one of a depth different from a depth of the gate-runner trench or a width different from a width of the gate-runner trench.

14. The apparatus of claim 8, further comprising:
a floating-field implant defined within the epitaxial layer and disposed around the gate-runner trench, the floating-field implant having a dopant concentration different from a dopant concentration of at least one of the plurality of trench semiconductor devices.

15. An apparatus, comprising:
a first doped region within a floating-field region of an epitaxial layer of a substrate, the first doped region having a bottom interface and at least one side interface in direct contact with the epitaxial layer, the first doped region defining a pn-junction with the epitaxial layer;
at least a portion of a second doped region disposed within an active region of the epitaxial layer;
a continuous gate-runner trench disposed within a gate-runner region of the epitaxial layer, the gate-runner region of the epitaxial layer being disposed between the active region of the epitaxial layer and the floating-field region of the epitaxial layer; and
a polysilicon material disposed within the continuous gate-runner trench and at least one device trench that is disposed in the substrate, the polysilicon material being in contact with the epitaxial layer and an active area implant disposed in the substrate.

16. The apparatus of claim 15, wherein the first doped region and the second doped region are formed using a same implant process.

17. The apparatus of claim 15, further comprising:
a recess disposed within the polysilicon material in the gate-runner trench; and
a metallic material disposed within the recess.

18. The apparatus of claim 15, wherein the first doped region has a first dopant concentration different from a dopant concentration of the second doped region.

* * * * *